US00RE41972E

(19) United States
(12) Reissued Patent
Lenander et al.

(10) Patent Number: US RE41,972 E
(45) Date of Reissued Patent: Nov. 30, 2010

(54) ALUMINUM OXIDE COATED TOOL

(75) Inventors: Anders Lenander, Tyreso (SE); Bjorn Ljungberg, Enskede (SE)

(73) Assignee: Sandvik Intellectual Property AB, Sandviken (SE)

(21) Appl. No.: 11/653,420

(22) Filed: Jan. 16, 2007

Related U.S. Patent Documents

Reissue of:
(64) Patent No.: 5,861,210
Issued: Jan. 19, 1999
Appl. No.: 08/497,934
Filed: Jul. 5, 1995

(30) Foreign Application Priority Data

Jul. 20, 1994 (SE) ..... 9402543-4

(51) Int. Cl.
*B23B 27/14* (2006.01)
*C23C 16/30* (2006.01)

(52) U.S. Cl. ..... 428/336; 51/295; 51/307; 51/309; 428/216; 428/469; 428/698; 428/701; 428/702; 407/119; 427/255.31; 427/419.1; 427/419.2; 427/419.7

(58) Field of Classification Search ..... 51/295, 51/307, 309; 428/216, 336, 469, 698, 701, 428/702; 407/119; 427/255.3, 419.1, 419.2, 427/419.7
See application file for complete search history.

(56) References Cited

U.S. PATENT DOCUMENTS

| | | | |
|---|---|---|---|
| RE29,420 | E | 9/1977 | Lindstrom et al. |
| 4,180,400 | A | 12/1979 | Smith et al. |
| 4,357,382 | A | 11/1982 | Lambert et al. |
| 4,399,168 | A | 8/1983 | Kullander et al. |
| 4,525,415 | A | 6/1985 | Porat |
| RE32,110 | E | 4/1986 | Hale |
| 4,608,098 | A | 8/1986 | Hale |
| 4,619,866 | A | 10/1986 | Smith et al. |
| 4,643,620 | A | 2/1987 | Fujii et al. |
| 4,966,501 | A | 10/1990 | Nomura et al. |
| 5,071,696 | A | 12/1991 | Chatfield et al. |
| 5,137,774 | A | 8/1992 | Ruppi |
| 5,487,625 | A | 1/1996 | Ljungberg et al. |

FOREIGN PATENT DOCUMENTS

EP 0 603 144 A1 6/1994

(Continued)

OTHER PUBLICATIONS

Trial Demand for Invalidation of Related Japanese Patent No. 3761932 dated May 22, 2007.
Office Action in Invalidation Trial of Related Japanese Patent No. 3761932 dated Feb. 13, 2009.
Kim, Jae–Gon et al., Effect of Partial Pressure of the Reactant Gas on the Chemical Vapour Deposition of $Al_2O_3$ *Thin Solid Films,* vol. 97, 1982, pp. 97–106.
Nils Hedar, "Att utveckia svarvverktyg", *Verkstäderna,* nr. 11, Sep. 10, 1990, sid. 26, sp. 2, rad 39–52, pp. 22–26.

(Continued)

*Primary Examiner*—Timothy M Speer
(74) *Attorney, Agent, or Firm*—Drinker Biddle & Reath LLP

(57) ABSTRACT

There is provided a tool at least partly coated with at least two refractory layers of which one of the said layers is a fine-grained $\alpha$-$Al_2O_3$-layer which is the top layer along the cutting edge-line and the other a $TiC_xN_yO_z$- or a $ZrC_xN_y$-layer being the top layer on the clearance face. The coated tool exhibits excellent flank and crater wear and high resistance to flaking, particularly when used for machining of low carbon steel and stainless steel. Used cutting edges can easily be identified by the naked eye.

22 Claims, 2 Drawing Sheets

FOREIGN PATENT DOCUMENTS

| | | | |
|---|---|---|---|
| EP | 0 693 574 | A1 | 1/1996 |
| GB | 1 389 140 | | 4/1975 |
| JP | 49-66513 | | 6/1974 |
| JP | 51-42030 | | 4/1976 |
| JP | 58-67861 | | 4/1983 |
| JP | 58-177267 | | 10/1983 |
| JP | 60-048211 | | 3/1985 |
| JP | 62-084903 | | 4/1987 |
| JP | 64-16302 | | 1/1989 |
| JP | 64-031972 | | 2/1989 |
| JP | 1-180980 | | 7/1989 |
| JP | 2-218522 | | 8/1990 |
| JP | 05-009743 | | 1/1993 |
| JP | 5-57507 | | 3/1993 |
| JP | 05-057507 | * | 3/1993 |
| JP | 05-128966 | | 5/1993 |
| JP | 06-045727 | | 2/1994 |
| JP | 6-55311 | | 3/1994 |
| JP | 06-316758 | | 11/1994 |
| JP | 2825693 | | 9/1998 |

OTHER PUBLICATIONS

Derwent's Abstract, 77–67577Y/38, abstract of JP–A–52 094813 (Mitsubishi Met. Corp. and Elec.), publication week 197738.

Patent Abstracts of Japan, vol. 13, No. 252, M–836, abstract of JP–A–01 58402 (Daijietsuto Kogyo K.K.), published Mar. 6, 1989.

Patent Abstracts of Japan, vol. 4, No. 155, C–29, Oct. 29, 1980 & JP–A–55 100978 (Mitsubishi Metal Corp), Aug. 1, 1980.

Derwent Publications Ltd, London, GB; AN 95–153296 & SE–A–9 400 612 (Sandvik AB), Feb. 8, 1995.

* cited by examiner

FIG. 1A
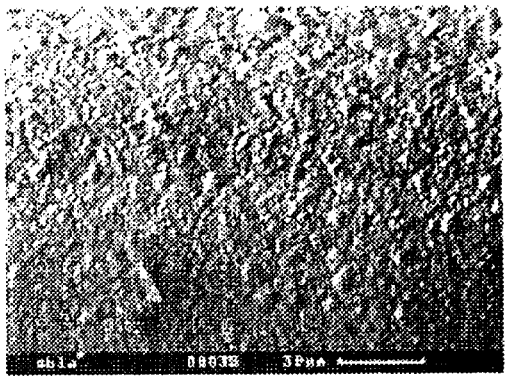
FIG. 1B
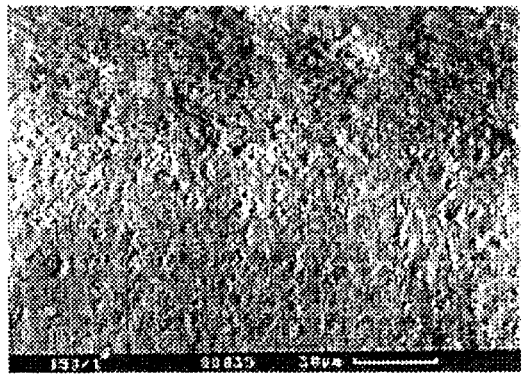
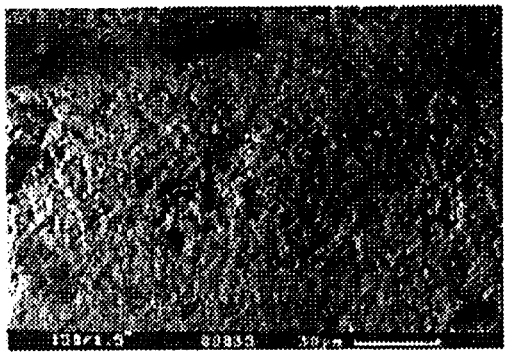
FIG. 1C
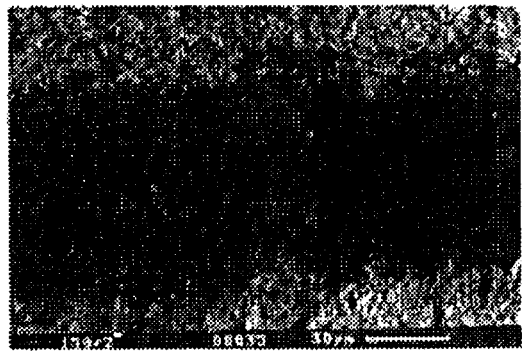
FIG. 1D

FIG. 1E
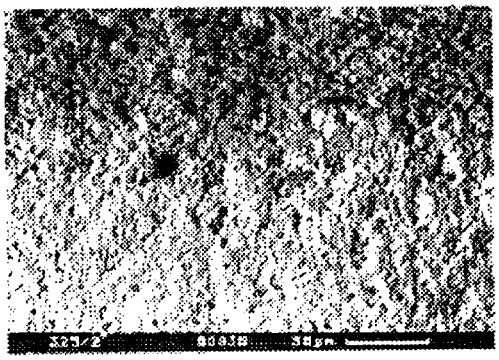
FIG. 1F
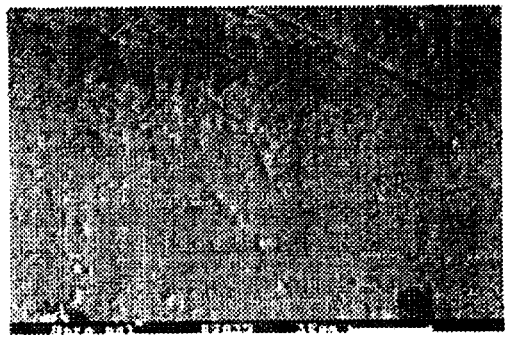
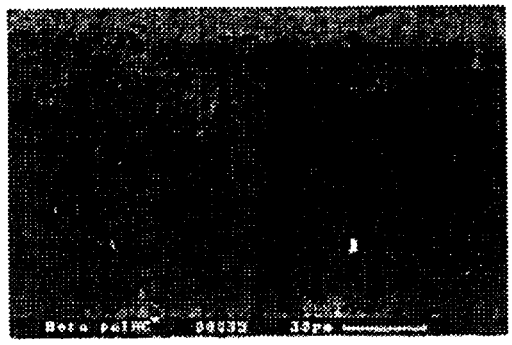
FIG. 1G

ALUMINUM OXIDE COATED TOOL

Matter enclosed in heavy brackets [ ] appears in the original patent but forms no part of this reissue specification; matter printed in italics indicates the additions made by reissue.

*CROSS-REFERENCES TO RELATED APPLICATIONS*

*This application is a reissue of U.S. Pat. No. 5,861,210, which claims the benefit of priority to Swedish Application No. 9402543-4 filed Jul. 20, 1994.*

BACKGROUND OF THE INVENTION

The presently claimed invention relates to an $Al_2O_3$-coated cutting tool suitable for machining of metals by turning, milling, drilling or by similar chipforming machining methods.

Modern high productivity chipforming machining of metals requires reliable tools with excellent wear properties. This has so far been achieved by employing a cemented carbide tool body coated with a wear resistant coating. The cemented carbide tool body is generally in the shape of an indexable insert clamped in a tool holder.

The most commonly used wear resistant layers are TiC, TiN, and $Al_2O_3$. Both single layer and multilayer coatings are employed. CVD, PVD or similar coating techniques are used for depositing the different layers onto the cemented carbide body.

During the past five to ten years, coated cemented carbide tools have been improved considerably with respect to reliability and tool life.

During, e.g., a turning and cutting operation, the coated tool is worn continuously on its rake face by the formed metal chip which causes crater wear. The machined workpiece also slides along the clearance face of the tool causing flank wear.

During high speed cutting, the tool edge may reach a very high temperature at the rake face. This leads to a diffusion type crater wear on the rake face of the tool. On the clearance face of the tool, the temperature is significantly lower mainly so that abrasive type wear occurs.

It is generally accepted that an $Al_2O_3$-layer performs best on the rake face due to its excellent ability to withstand diffusion type wear. Layers of the type $MeC_xN_yO_z$, where Me is a metal selected from the group consisting of the Groups IVB, VB, and VIB of the Periodic Table, generally Ti and where (x+y+z)=1, which type is hereafter denoted by $TiC_xN_yO_z$, generally performs better on the clearance face. $Al_2O_3$-layers on the other hand, wear relatively fast on the clearance face and develop flank wear relatively quickly on that face. The flank wear will be particularly large for thick, >4 μm, $Al_2O_3$-layers. Flank wear influences the machined surface and may therefore limit tool life. For $TiC_xN_yO_z$-type layers, the situation is almost the reverse, that is, they exhibit low flank wear and faster crater wear than $Al_2O_3$.

It is desirable to have a tool with high wear resistance on both the clearance face and on the rake face at the same time.

Other factors influencing cutting performance of a coated tool include spalling or flaking of the coatings. Flaking accelerates tool wear, in particular the flank wear. Flaking may be the result of inferior coating adhesion or it may be due to the smearing or welding of workpiece material onto the cutting edge and a successive withdrawal of the coating. This may occur when the adhesion strength between the chip formed and the coating material is sufficiently high.

Some steels are more difficult to machine than others due to smearing and resulting flaking, for example, stainless steel and low carbon steel.

Nowadays, less machining per each component is needed. The requirements for high surface finish of the machined component only allow tools with a clean smooth cutting edge-line with very little developed wear to be used. It is becoming more and more difficult for the machine operator by the naked eye to differentiate between a little used and an unused cutting edge ("edge identification"). This is particularly difficult if the top layer is $Al_2O_3$ which color is dark grey or black. By mistake, using a used tool cutting edge, e.g., during an unmanned night shift run may cause component rejection or even unwanted production stops. Edge identification can more easily be done if the insert has a top layer of $TiC_xN_yO_z$ or in particular if the top layer is a goldish TiN-, ZrN- or HfN-layer.

In U.S. Pat. No. 4,643,620, the coating thickness is reduced along the edge by a mechanical treatment such as brushing, lapping or barrel polishing. The object is mainly to reduce the coating thickness along the cutting edge which is claimed to improve the toughness behavior of the cutting tool.

U.S. Pat. No. 4,966,501 discloses a method of reducing edge damages during cutting by reducing the coated surface roughness by employing a mechanical polishing, lapping or brush honing. This method is according to the findings of the present inventors not sufficient to minimize smearing.

OBJECTS AND SUMMARY OF THE INVENTION

It is an object of this invention to avoid or alleviate the problems of the prior art.

It is further an object of this invention to provide improvements in coated bodies with respect to the tendency of smearing/welding of workpiece material onto the cutting edge, cutting edge flaking resistance, simultaneous high resistance to crater and flank wear and to make "used edge identification" possible.

In one aspect of the invention there is provided a cutting tool insert made of cemented carbide, titanium based carbonitride or ceramics comprising a body of generally polygonal or round shape having an upper face, an opposite face and at least one clearance face intersecting said upper and lower faces to define a cutting edge, said insert being at least partly coated with at least two refractory layers of which one is a fine-grained $\alpha$-$Al_2O_3$-layer and the other is an $MeC_xN_yO_z$-layer where Me is a metal selected from the group consisting of metals in the Groups IVB, VB and VIB of the Periodic Table and (x+y+z)=1, said $Al_2O_3$-layer being the top layer along the cutting edge-line and said $MeC_xN_yO_z$-layer being the top layer on the clearance face.

In another aspect of the invention there is provided a method of making a cutting tool insert comprising a body of generally polygonal or round shape having an upper face, an opposite face and at least one clearance face intersecting said upper and lower faces to define a cutting edge, said body made of cemented carbide, titanium based carbonitride or ceramics comprising coating said insert at least partially with at least two refractory layers of which the next outermost is a fine-grained $\alpha$-$Al_2O_3$-layer and a top $MeC_xN_yO_z$-layer where Me is a metal selected from the group consisting of metals in the Groups IVB, VB, VIB of the Periodic Table and (x+y+z)=1 removing said top $MeC_xN_yO_z$-layer at least along the cutting edge-line leaving said layer essentially untouched on the clearance face.

BRIEF DESCRIPTION OF THE DRAWINGS

The invention is illustrated by FIGS. 1A–1G which show the surface condition after different post treatments.

DETAILED DESCRIPTION OF THE PREFERRED EMBODIMENTS OF THE INVENTION

The inventors have made great efforts to find means to reduce the smearing of workpiece material onto the cutting edge in order to improve edge flaking and flank wear resistance. It has been found by comparative cutting tests with different top layers that $Al_2O_3$ is less prone to smearing than layers of the type $TiC_xN_y\mathbf{0}_z$. In particular, fine-grained smooth $\alpha$-$Al_2O_3$ is very suitable as a coating material along the cutting edge in order minimize smearings and thereby reduce the risk of edge-line flaking.

The fine-grained $\alpha$-$Al_2O_3$ layers may, e.g., be any of the types disclosed in U.S. patent Ser. Nos. 08/159,217 (our reference: 024000-993) and 08/366,107 (our reference: 024444-093) or most likely also any other fine-grained $\alpha$-$Al_2O_3$-layer with other preferred growth direction.

Although tools with a top layer of a fine-grained $\alpha$-$Al_2O_3$, such as described in the above patent applications have excellent cutting properties they do not always comply with today's requirements since they, e.g., suffer from the following drawbacks:

"used edge identification" is difficult with the naked eye high initial flank wear is generally obtained for tools with $Al_2O_3$ top layers >4 μm.

As mentioned above, edge identification and improved flank wear can be obtained by applying a top layer of $TiC_xN_yO_z$. However, such a top layer will severely increase smearing along the edge-line when machining the difficult materials mentioned above.

The inventors have solved this problem by mechanically removing the $TiC_xN_yO_z$-layer either from only the cutting edge-line or from both the rake face and the cutting edge-line.

By employing this method and keeping the $TiC_xN_yO_z$-layer intact on the clearance face, several requirements have been fulfilled simultaneously:

excellent wear resistance simultaneously on the rake face and on the clearance face;

excellent flaking resistance; and easily identifiable used cutting edges.

According to the presently claimed invention, there now exists a cutting tool insert comprising a body of generally polygonal or round shape having an upper face, an opposite face and at least one clearance face intersecting said upper and lower faces to define cutting edges made of cemented carbide, titanium based carbonitride or ceramics. The insert is at least partly coated with at least two refractory layers. One is a fine-grained, grain size 0.5–4.0 μm, preferably 0.5–2.0 μm, $\alpha$-$Al_2O_3$-layer being the top layer along the cutting edge-line and the other is a $TiC_xN_yO_z$- or a $ZrC_xN_y$-cutting-layer, preferably a TiN-, ZrN-, TiCN- and/or TiC-layer being the top layer on the clearance face. The $\alpha$-$Al_2O_3$-layer preferably has a texture in the (012)-direction or (104)-direction. A Texture Coefficient, TC, can be defined as:

$$TC(hkl) = \frac{I(hkl)}{I_o(hkl)}\left\{\frac{3}{n}\sum\frac{I(hkl)}{I_o(hkl)}\right\}^{-1}$$

where

I(hkl)=measured intensity of the (hkl) reflection.

$I_0$(hkl)=standard intensity of the ASTM standard powder pattern diffraction data.

n=number of reflections used in the calculation, (hkl) reflections used are: (012), (104), (110), (113), (024), (116).

According to the invention, TC for the set of (012) crystal planes is larger than 1.3, preferably larger than 1.5, and for the set of (104) crystal planes TC is larger than 1.5, preferably larger than 2.5, and most preferably larger than 3.0.

The $\alpha$-$Al_2O_3$-layer has a thickness of 2–12 μm, preferably 4–8 μm. The other layer has a thickness of 0.1–5 μm, preferably 1–4 μm. The total thickness of the coating including also other layers is <20 μm.

According to the method of the presently claimed invention, a cutting tool insert made of cemented carbide, titanium based carbonitride or ceramics is at least partly coated with at least two refractory layers of which the next outermost layer is a fine-grained $\alpha$-$Al_2O_3$-layer and the outermost is a $MeC_xN_y\mathbf{0}_z$-layer, where Me is a metal selected from the group consisting of metals in the groups IVB, VB, VIB of the Periodic Table, preferably Ti or Zr. This top $MeC_xN_yO_z$-layer is removed along the cutting edge-line or on the cutting edge-line as well as the rake face leaving said layer essentially untouched on the clearance face.

The methods used to remove the layer can be: brushing with a brush with straws containing, e.g., SiC or other grinding media, polishing with diamond paste, controlled directed blasting with, e.g., $Al_2O_3$-powders with or without masking off the clearance face. Also combinations of these methods are possible.

The aim of the mechanical treatment in the presently claimed invention is as mentioned to remove the top $TiC_xN_yO_z$-layer and expose the fine-grained $\alpha$-$Al_2O_3$ layer along the edge or also the entire rake face. A reduction of coating thickness along the edge-line is not desired. The used mechanical method should be so gentle that only the top $TiC_xN_yO_z$-layer is removed leaving the $Al_2O_3$ at the edge-line as untouched as possible.

The invention is additionally illustrated in connection with the following Examples which are to be considered as illustrative of the presently claimed invention. It should be understood, however, that the invention is not limited to the specific details of the Examples.

EXAMPLE 1

Cemented carbide cutting inserts CNMG 120408-QM with the composition 5.5% Co, 8.6% cubic carbides (TiC-TaC-NbC) and balance WC were coated with CVD-technique according to the following sequence: 0.7 μm TiC, 0.5 μm Ti(CO), 8.0 μm Ti(CN), 3.0 μm $Al_2O_3$ and 2.8 μm TiN.

The $Al_2O_3$-layer was deposited with a method that gives a fine-grained $\alpha$-$Al_2O_3$ layer according to U.S. Ser. No. 08/159,217 (our reference: 024000-993). The TiN-layer was deposited at 400 mbar and the other layers according to prior art techniques.

The coated inserts were post treated with different methods according to below:

Variant 1A: No post treatment.

Variant 1B: Wet blasting with 150 mesh $Al_2O_3$-grits at 1.0 bar.

Variant 1C: Wet blasting with 150 mesh $Al_2O_3$-grits at 1.5 bar.

Variant 1D: Wet blasting with 150 mesh $Al_2O_3$-grits at 2.0 bar.

Variant 1E: Wet blasting with 325 mesh $Al_2O_3$-grits at 2.0 bar.

Variant 1F: Brushing with a cylindrical nylon brush containing SiC.

Variant 1G: As 1F but with the center of the brush closer to the insert in order to get more efficient treatment.

The different treatments resulted in different degrees of thinning and smoothness of the outer TiN-layer:

Variant 1B: A much smoother surface than 1A. The TiN-layer covering the whole surface of the insert.

Variant 1C: A much smoother surface than 1A. The TiN-layer covering the whole surface of the insert.

Variant 1D: A much smoother surface than 1A. The TiN-layer is removed along the whole edge-line exposing the $Al_2O_3$-layer.

Variant 1E: As 1B.

Variant 1F: A much smoother surface than 1A. The TiN-layer covering the whole surface of the insert.

Variant 1G: A much smoother surface than 1A. The TiN layer is removed along the whole edge-line exposing the $Al_2O_3$-layer.

The surface condition of the variants is illustrated by FIGS. 1A–1G.

EXAMPLE 2

Cemented carbide cutting inserts CNMG 120408-QM with the composition 5.5% Co, 8.6% cubic carbides (TiC-TaC-NbC) and balance WC were coated with CVD-technique according to the following sequence: 0.6 μm TiC, 0.4 μm Ti(CO), 8.1 μm Ti(CN), 8.1 μm on $Al_2O_3$ and 0.9 μm TiN.

The $Al_2O_3$-layer was deposited with a method that gives a fine-grained $\alpha$-$Al_2O_3$ layer according to U.S. Ser. No. 08/159,217 (our reference: 024000-993). The TiN-layer was deposited at 400 mbar and the other layers according to prior art techniques.

The coated inserts were post treated with different methods according to below:

Variant 2A: No post treatment.

Variant 2B: Wet blasting with 150 mesh $Al_2O_3$-grits resulting in a smoother surface. Here the top TiN-layer was removed along the edge-line as well as on the whole rake face exposing the black $Al_2O_3$-layer.

Variant 2C: Brushing with a cylindrical SiC-containing nylon brush. This treatment resulted in a smooth surface with only the top TiN-layer removed along the edge-line exposing the $Al_2O_3$.

EXAMPLE 3

Cemented carbide cutting inserts CNMG 120408-QM with the composition 5.5% Co, 8.6% cubic carbides (TiC-TaC-NbC) and balance WC were coated with CVD-technique according to the following sequence: 1.0 μm TiC, 0.4 μm Ti(CO), 7.9 μm Ti(CN) and 5.5 μm $Al_2O_3$.

The $Al_2O_3$-layer was deposited with a method that gives a fine-grained $\alpha$-$Al_2O_3$ layer according to U.S. Ser. No. 08/159,217 (our reference: 024000-993).

The inserts were treated by wet blasting with 150 mesh $Al_2O_3$-grits (Variant 3).

EXAMPLE 4

Cemented carbide cutting inserts CNMG 120408-QM with the composition 6.5% Co, 8.7% cubic carbides (TiC-TaC-NbC) and balance WC and with a 25 μm thick binder phase enriched zone were coated with CVD-technique according to the following sequence: 7.9 μm TiC, 4.2 μm $Al_2O_3$ and 3.5 μm TiC.

The $Al_2O_3$-layer was deposited with a method that gives a fine-grained $\alpha$-$Al_2O_3$-layer according to U.S. Ser. No. 08/159,217 (our reference: 024000-993).

Variant 4A: No post treatment.

Variant 4B: The inserts were brushed with a cylindrical SiC-containing nylon brush, resulting in a smooth surface exposing the $Al_2O_3$-layer along the whole edge-line.

EXAMPLE 5

Cemented carbide cutting inserts CNMG 120408-QM with the composition 6.5% Co, 8.7% cubic carbides (TiC-TaC-NbC) and balance WC and with a 25 μm thick binder phase enriched surface zone were coated with CVD-technique according to the following sequence: 7.0 μm TiC and 5.1 μm $Al_2O_3$.

The $Al_2O_3$-layer was deposited with a method that gives a fine-grained $\alpha$-$Al_2O_3$ layer according to U.S. Ser. No. 08/159,217 (our reference: 024000-993).

The inserts were treated by wet blasting with 150 mesh $Al_2O_3$-grits (Variant 5).

EXAMPLE 6

Cemented carbide cutting inserts CNMG 120408-QM with the composition 6.5% Co, 8.7% cubic carbides (TiC-TaC-NbC) and balance WC and with a 25 μm thick binder phase enriched surface zone were coated with CVD-technique according to the following sequence: 5.4 μm Ti(CN), 5.3 μm $Al_2O_3$ and 1.3 μm TiN.

The $Al_2O_3$-layer was deposited according to prior art technique resulting in a layer of mixed $\alpha$- and $\kappa$-polymorphs. The TiN-layer was deposited at 400 mbar and the other layers according to prior art techniques.

Variant 6A: Not post treated.

Variant 6B: Wet blasting with 150 mesh $Al_2O_3$-grits resulting in a smoother surface and the top TiN-layer removed along the edge-line as well as on the whole rake face exposing the $Al_2O_3$.

Variant 6C: Brushing with a cylindrical SiC-containing nylon brush resulting in a smooth surface and exposing the $Al_2O_3$-layer along the whole edge-line.

EXAMPLE 7

Tool inserts from examples 1–6 were tested with respect of edge-line flaking in a facing operation in an alloyed steel (AISI 1518, W-no. 1,0580). The shape of the workpiece was such that the cutting edge was intermitted three times during each revolution. Cutting data:

Cutting speed: 130–220 m/min

Feed: 0.2 mm/rev

Depth of cut: 2.0 mm

The inserts were run one cut over the workpiece. The results below are expressed as percentage of the edge-line in cut that obtained flaking of the coating.

| Variant | Post Treatment | $Al_2O_3$ Exposed | % Edge Line Flaking at edge |
|---|---|---|---|
| 1A | None | No | 63 |
| 1B | Blasted | No | 80 |

-continued

| Variant | Post Treatment | $Al_2O_3$ Exposed | % Edge Line Flaking at edge |
|---|---|---|---|
| 1C | Blasted | No | 84 |
| 1D | Blasted | Yes | 18 |
| 1E | Blasted | No | 70 |
| 1F | Brushed | No | 66 |
| 1G | Brushed | Yes | 0 |
| 2A | None | No | 57 |
| 2B | Blasted | Yes | 0 |
| 2C | Brushed | Yes | 0 |
| 3 | Blasted | Yes | 0 |
| 4A | None | No | 87 |
| 4B | Brushed | Yes | 0 |
| 5 | Blasted | Yes | 0 |
| 6A | None | No | 83 |
| 6B | Blasted | Yes | 27 |
| 6C | Brushed | Yes | 33 |

As can be seen from above, the best results have been obtained when the fine-grained $\alpha$-$Al_2O_3$-layer has been exposed at the edge-line. Post treatment resulting in a smoother coating surface but not exposure of the $\alpha$-$Al_2O_3$ does not result in any improvement of the flaking resistance. Variants 6B and 6C with the $\alpha/\kappa$-polymorphs exposed at the edge-line do not obtain as good flaking resistance as the Variants with $\alpha$-$Al_2O_3$-layer exposed at the edge-line.

EXAMPLE 8

Cutting inserts from Examples 4 and 5 were run in longitudinal turning of a ball bearing steel SKF 25B.

Cutting data:

Cutting speed: 180 m/min

Feed: 0.36 mm/rev

Depth of cut: 2,0 mm, coolant was used

The flank wear was measured after 2.5 min in order to study the initial wear.

| Variant | Flank Wear, mm |
|---|---|
| 4B | 0.13 |
| 5 | 0.20 |

This Example illustrates the improved flank wear resistance due to the top TiC layer on the flank face.

The principles, preferred embodiments and modes of operation of the presently claimed invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A cutting tool insert made of cemented carbide, titanium based carbonitride or ceramics having an improved resistance to smearing of the workpiece material on the cutting edge comprising a body of generally polygonal or round shape having an upper face, an opposite face and at least one clearance face intersecting said upper and lower faces to define a cutting edge, said insert being at least partly coated with at least two refractory layers of which one is a fine-grained $\alpha$-$Al_2O_3$-layer and the other is an $MeC_xN_yO_z$-layer where Me is a metal selected from the group consisting of the metals in the Groups IVB, VB and VIB of the Periodic Table and (x+y+z)=1, said $Al_2O_3$-layer being the top layer along the cutting edge-line *and on the upper face* and said $MeC_xN_yO_z$-layer being the top layer on the clearance face.

2. The cutting tool insert of claim 1 wherein said $\alpha$-$Al_2O_3$-layer has a texture in the (012)-direction or (104)-direction.

3. The cutting tool insert of claim 1 wherein Me is Ti or Zr.

4. The cutting tool insert of claim 3 wherein the layer on the clearance face is TiN, ZrN, TiCN or TiC.

5. The cutting tool insert of claim 1 wherein a fine-grained $\alpha$-$Al_2O_3$ layer is present between the body and the $MeC_xN_yO_z$ layer on the clearance face.

6. The cutting tool insert of claim 1 wherein the $Al_2O_3$ thickness is 2–12 μm.

7. A method of making a cutting tool insert comprising a body of generally polygonal or round shape having an upper face, an opposite face and at least one clearance face intersecting said upper and lower faces to define a cutting edge, said body made of cemented carbide, titanium based carbonitride or ceramics comprising coating said insert at least partially with at least two refractory layers of which the next outermost is a fine-grained $\alpha$-$Al_2O_3$-layer and a top $MeC_xN_yO_z$-layer where Me is a metal selected from the group consisting of metals in the groups IVB, VB, VIB of the Periodic Table and (x+y+z)=1 and removing said top $MeC_xN_yO_z$-layer [at least] along the cutting edge-line *and on the upper face,* leaving said layer essentially untouched on the clearance face.

8. The method of claim 7 wherein said top layer is removed by brushing with a brush containing SiC or by blasting with $Al_2O_3$-grits.

9. The method of claim 7 wherein said $\alpha$-$Al_2O_3$-layer has a texture in the (012)-direction or (104)-direction.

10. The method of claim 7 wherein Me is Ti or Zr.

11. The method of claim 10 wherein said $MeC_xN_yO_z$-layer comprises TiN, ZrN, TiCN or TiC.

12. The method of claim 7 wherein said $\alpha$-$Al_2O_3$-layer thickness is 2–12 μm.

*13. The method of claim 7 wherein said $\alpha$-$Al_2O_3$-layer has a texture in the (012)-direction or (104)-direction and wherein Me is Ti or Zr.*

*14. The method of claim 13 wherein the $MeC_xN_yO_z$ layer is TiN, ZrN, TiCN or TiC.*

*15. The method of claim 14 wherein the $Al_2O_3$ thickness is 2–12 μm.*

*16. The method of claim 14 wherein said upper layer is removed by blasting with $Al_2O_3$- grits.*

*17. The cutting tool insert of claim 1 wherein said $\alpha$-$Al_2O_3$-layer has a texture in the (012)-direction or (104)-direction and wherein Me is Ti or Zr.*

*18. The cutting tool insert of claim 17 wherein the layer on the clearance face is TiN, ZrN, TiCN or TiC.*

*19. The cutting tool insert of claim 18 wherein a fine-grained $\alpha$-$Al_2O_3$-layer is present between the body and the $MeC_xN_yO_z$ layer on the clearance face.*

*20. The cutting tool insert of claim 19 wherein the $Al_2O_3$ thickness is 2–12 μm.*

*21. The cutting tool insert of claim 1 wherein the $Al_2O_3$-layer is the top layer on substantially the whole upper face.*

*22. The method of claim 7 wherein the $MeC_xN_yO_z$-layer is removed from substantially the whole upper face.*

* * * * *